United States Patent
Kiyose (10) Patent No.: US 8,211,810 B2
(45) Date of Patent: Jul. 3, 2012

(54) SUBSTRATE PROCESSING APPARATUS AND SUBSTRATE PROCESSING METHOD FOR PERFORMING ETCHING PROCESS WITH PHOSPHORIC ACID SOLUTION

(75) Inventor: Hiromi Kiyose, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 866 days.

(21) Appl. No.: 12/203,394

(22) Filed: Sep. 3, 2008

(65) Prior Publication Data

US 2009/0081881 A1  Mar. 26, 2009

(30) Foreign Application Priority Data

Sep. 21, 2007 (JP) .................. 2007-245315
Mar. 21, 2008 (JP) .................. 2008-073396

(51) Int. Cl.
*H01L 21/302* (2006.01)
(52) U.S. Cl. ............ 438/753; 438/745; 216/37; 216/67; 252/79.1; 252/79.2; 252/79.3; 252/79.4
(58) Field of Classification Search .................. 438/745, 438/753; 216/37, 67; 252/79.2, 79.3
See application file for complete search history.

(56) References Cited

U.S. PATENT DOCUMENTS

| | | | |
|---|---|---|---|
| 3,859,222 A * | 1/1975 | Squillace et al. ............ 252/79.3 |
| 5,472,562 A | 12/1995 | Ziger | |
| 6,001,215 A | 12/1999 | Ban | |
| 2005/0230045 A1 | 10/2005 | Okuchi et al. | |
| 2005/0245409 A1 | 11/2005 | Cernat et al. | |

FOREIGN PATENT DOCUMENTS

| | | |
|---|---|---|
| JP | 8-64574 | 3/1996 |
| JP | 9-275091 | 10/1997 |
| JP | 2003-224106 | 8/2003 |
| JP | 2005-311316 | 11/2005 |
| JP | 2006-202260 | * 7/2006 |
| JP | 2007-194647 | 8/2007 |
| JP | 2007-258405 | 10/2007 |
| JP | 2007-318057 | 12/2007 |
| JP | 2008-311436 | 12/2008 |
| JP | 2009-021538 | 1/2009 |

OTHER PUBLICATIONS

Chinese Patent Office Action dated Nov. 20, 2009 in corresponding Chinese Patent Application No. 200810145403X (with English language translation of Abstract).
May 19, 2010 Korean Office Action issued in connection with corresponding application 10-2008-0068043.

(Continued)

*Primary Examiner* — Nadine G Norton
*Assistant Examiner* — Maki Angadi
(74) *Attorney, Agent, or Firm* — Ostrolenk Faber LLP (57) ABSTRACT

An additive containing a hexafluorosilicic acid solution ($H_2SiF_6+H_2O$) is sequentially inputted into a phosphoric acid solution pooled in an immersion bath from an additive input mechanism. Further, a trap agent containing a fluoroboric acid solution ($HBF_4+H_2O$) is inputted into the phosphoric acid solution from a trap agent input mechanism. $F^-$ which accelerates etching of a silicon nitride film is added as appropriate by sequentially inputting the additive and siloxane which increases by the sequential input is etched with hydrofluoric acid generated by decomposition of the fluoroboric acid, to thereby suppress a significant increase in the concentration of siloxane. This makes it possible to maintain respective initial etching rates of the silicon nitride film and a silicon oxide film.

5 Claims, 5 Drawing Sheets

OTHER PUBLICATIONS

Japanese translation provided by Korean atty and English translation of extract thereof.

Japanese Office Action mailed Feb. 23, 2012 in connection with corresponding Japanese Patent Application No. 2008-073396.

English translation of Japanese Office Action issued in connection with corresponding Japanese application provided as an explanation of prior art relevancy.

* cited by examiner

SUBSTRATE PROCESSING APPARATUS AND SUBSTRATE PROCESSING METHOD FOR PERFORMING ETCHING PROCESS WITH PHOSPHORIC ACID SOLUTION

BACKGROUND OF THE INVENTION

1. Field of the Invention

The present invention relates to a substrate processing apparatus and a substrate processing method for performing an etching process, specifically by immersing a substrate, such as a semiconductor wafer, a glass substrate for liquid crystal display, a glass substrate for photomask or a substrate for optical disk, on which a silicon oxide film and a silicon nitride film are formed, in a phosphoric acid solution to selectively etch the silicon nitride film.

2. Description of the Background Art

An etching process is a very important process step for pattern formation in manufacturing semiconductor devices. In recent years, especially, with high performance and high integration of semiconductor devices, required is an etching process on a substrate on which a silicon nitride film ($Si_3N_4$ film) and a silicon oxide film ($SiO_2$ film) are formed, to selectively etch the silicon nitride film so that the silicon oxide film should be left on the substrate. As a method of selectively etching the silicon nitride film, an etching process using a phosphoric acid solution ($H_3PO_4+H_2O$) of high temperature (150° C. to 160° C.) as an etching solution is disclosed in Japanese Patent Application Laid Open Gazette No. 2003-224106. Specifically, a plurality of substrates on each of which a silicon nitride film and a silicon oxide film are formed are immersed in a processing bath in which a phosphoric acid solution of high temperature is pooled, to selectively etch the silicon nitride film. From a viewpoint of the characteristics of the phosphoric acid solution, however, a very small amount of silicon oxide film is etched.

When a process of etching a silicon nitride film is performed by using a phosphoric acid solution, usually, siloxane is generated. "Siloxane" is a generic name for a family of organic or inorganic compounds whose main ingredients are silicon (Si) and oxygen (O). Siloxane generated in an etching process accumulates in an etching solution as an extraneous matter. When the concentration of siloxane in an etching solution is too low, the etching speed of silicon oxide film becomes higher and the etching selection ratio of silicon nitride film becomes lower. On the other hand, when the concentration of siloxane in the etching solution is too high, the siloxane adheres to the processing bath or clogs a filter. Therefore, when the etching process is performed by using the phosphoric acid solution, it is important to adjust the concentration of siloxane in the etching solution in an appropriate range in accordance with the purpose of processing.

Since the concentration of siloxane in the etching solution is naturally low immediately after inputting a new phosphoric acid solution into a processing bath for the change of solution or the like, a method (seasoning) for increasing the concentration of siloxane, in which an etching process is performed on substrates not to be processed, on each of which the silicon nitride film is formed, has been conventionally performed in order to adjust the concentration into the appropriate range.

This method, however, has a problem that the down time of the apparatus is too long. Therefore, there is another possible method in which an additive containing siloxane is inputted into the phosphoric acid solution in advance, but this method arises a problem that it is impossible to keep the etching characteristics of the phosphoric acid solution constant because of decomposition or deterioration of the additive.

SUMMARY OF THE INVENTION

The present invention is intended for a substrate processing apparatus for performing an etching process by immersing a substrate on which a silicon oxide film and a silicon nitride film are formed into a phosphoric acid solution to etch the silicon nitride film.

According to an aspect of the present invention, the substrate processing apparatus comprises an immersion bath for pooling a phosphoric acid solution in which the substrate is immersed to etch a silicon nitride film, an additive input part for inputting an additive containing a hexafluorosilicic acid into the phosphoric acid solution in the immersion bath, and a trap agent input part for inputting a trap agent containing a fluoroboric acid into the phosphoric acid solution in the immersion bath.

Since $F^-$ is generated by inputting the additive containing the hexafluorosilicic acid into the phosphoric acid solution in the immersion bath and a significant increase in the concentration of siloxane is suppressed by inputting the trap agent containing the fluoroboric acid, it is possible to maintain both the etching rates of the silicon nitride film and the silicon oxide film and keep the etching characteristics of the phosphoric acid solution constant for a long time.

Preferably, the substrate processing apparatus further comprises an input control part for controlling the additive input part to sequentially input the additive at regular intervals.

Since the additive is sequentially inputted at regular intervals, $F^-$ can be added as appropriate and it is thereby possible to make the etching rate of the silicon nitride film stable for a long time.

More preferably, the input control part controls the trap agent input part to input the trap agent every time when the etching process is performed on one lot consisting of a predetermined number of substrates in the immersion bath.

Since the trap agent is inputted every time when the etching process is performed on one lot, it is possible to suppress a significant increase in the concentration of siloxane due to the etching process and make the etching rate of the silicon oxide film stable for a long time.

According to another aspect of the present invention, the substrate processing apparatus further comprises a concentration meter for measuring the concentration of siloxane contained in the phosphoric acid solution in the immersion bath, and in the substrate processing apparatus, the input control part controls the trap agent input part to input the trap agent when the concentration of siloxane measured by the concentration meter is not lower than a predetermined threshold value.

Since the trap agent is inputted when the concentration of siloxane contained in the phosphoric acid solution in the immersion bath is not lower than a predetermined threshold value, it is possible to suppress a significant increase in the concentration of siloxane due to the etching process and make the etching rate of the silicon oxide film stable for a long time.

The present invention is also intended for a substrate processing method for performing an etching process by immersing a substrate on which a silicon oxide film and a silicon nitride film are formed into a phosphoric acid solution to etch the silicon nitride film.

According to the present invention, the substrate processing method comprises the steps of a) performing a process of etching a silicon nitride film by immersing the substrate into a phosphoric acid solution, b) inputting an additive containing a hexafluorosilicic acid into the phosphoric acid solution, and c) inputting a trap agent containing a fluoroboric acid into the phosphoric acid solution.

Since F⁻ is generated by inputting the additive containing the hexafluorosilicic acid into the phosphoric acid solution and a significant increase in the concentration of siloxane is suppressed by inputting the trap agent containing the fluoroboric acid, it is possible to maintain both the etching rates of the silicon nitride film and the silicon oxide film and keep the etching characteristics of the phosphoric acid solution constant for a long time.

Therefore, it is an object of the present invention to keep the etching characteristics of the phosphoric acid solution constant for a long time.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the preferred embodiments of the present invention will be discussed in detail with reference to figures.

1. The First Preferred Embodiment

Figure 1:
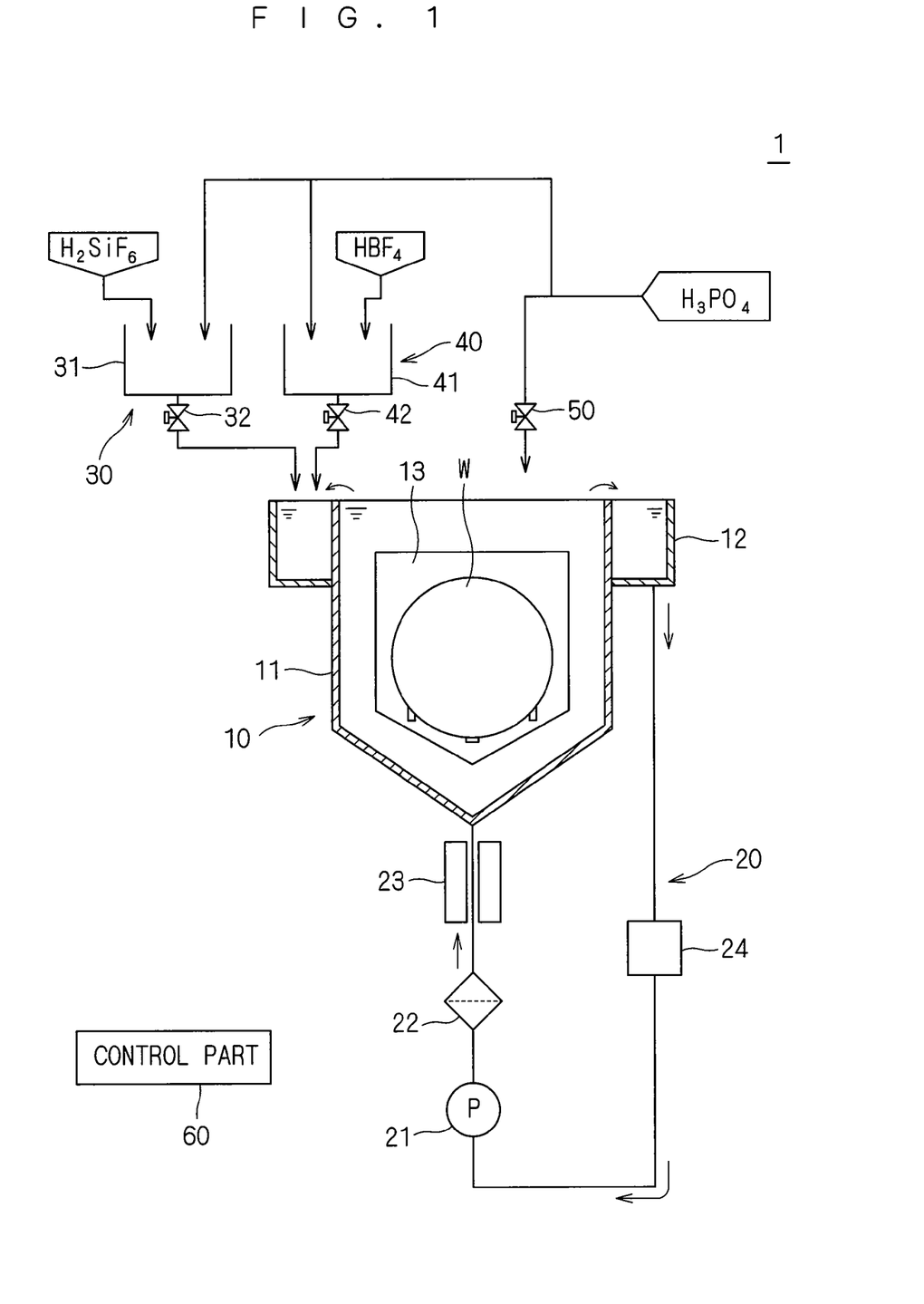
FIG. 1 is a view showing an overall schematic construction of a substrate processing apparatus in accordance with the present invention.

FIG. 1 is a view showing an overall schematic construction of a substrate processing apparatus in accordance with the present invention. This substrate processing apparatus 1 is a wet etching apparatus for performing an etching process, specifically by immersing a substrate W on which a silicon oxide film and a silicon nitride film are formed, in a phosphoric acid solution to selectively etch the silicon nitride film. The substrate processing apparatus 1 comprises an immersion bath 10 for pooling a phosphoric acid solution to perform an etching process, a circulation line 20 for circulating the phosphoric acid solution to the immersion bath 10, an additive input mechanism 30 for inputting an additive into the phosphoric acid solution in the immersion bath 10 and a trap agent input mechanism 40 for inputting a trap agent into the phosphoric acid solution in the immersion bath 10.

The immersion bath 10 has a double-bath structure consisting of an inside bath 11 for pooling the phosphoric acid solution as an etching solution and immersing a substrate W in the phosphoric acid solution and an outside bath 12 for collecting an etching solution which overflows from an upper portion of the inside bath 11. The inside bath 11 is a box-like member having a rectangular shape in a plan view, which is formed of quartz or fluorocarbon resin having excellent corrosion resistance against the etching solution. The outside bath 12 is formed of the same material as that of the inside bath 11 and so provided as to surround the outer peripheral upper end portion of the inside bath 11.

Further, a lifter 13 is provided to immerse the substrate W into the etching solution pooled in the immersion bath 10. The lifter 13 collectively holds a plurality of (e.g., fifty) substrates W arranged uprightly (with the normal of a main surface of the substrate along the horizontal direction) in parallel to one another, with three holding rods. The lifter 13 is so provided as to be moved in vertical direction by a not-shown elevation mechanism, and moves the substrates W (lot) held thereby between a processing position (the position of FIG. 1) where the substrates W are immersed into the etching solution in the inside bath 11 and a passing position where the substrates W are drawn out from the etching solution.

The circulation line 20 is a piping path to filter and heat the phosphoric acid solution discharged from the immersion bath 10 and circulate it to the immersion bath 10 again under pressure, and specifically, formed by connecting the bottom portion of the outside bath 12 of the immersion bath 10 to the bottom portion of the inside bath 11 with a duct. In the path of the circulation line 20, a circulation pump 21 and a filter 22 are provided from the upstream side. The circulation pump 21 sends the phosphoric acid solution drawn out from the outside bath 12 through the circulation line 20 to the inside bath 11 under pressure. The filter 22 is provided to clear extraneous matters from the phosphoric acid solution flowing in the circulation line 20.

The circulation line 20 is further provided with a heater 23 on the downstream side of the filter 22. The heater 23 is provided closest to the inside bath 11 in the circulation line 20, to heat the phosphoric acid solution flowing in the circulation line 20 to a predetermined processing temperature (150° C. in this preferred embodiment) again. The immersion bath 10 is also provided with a not-shown heater and heats the phosphoric acid solution pooled in the immersion bath 10 to keep the predetermined processing temperature.

Further, a concentration meter 24 is inserted on the upstream side of the circulation pump 21 (on the side closer to the outside bath 12) in the path of the circulation line 20. The concentration meter 24 is a type of concentration meter which measures the concentration of siloxane contained in a solution by measuring the absorbance of a specific wavelength, and serves to measure the concentration of siloxane contained in the phosphoric acid solution discharged from the outside bath 12 of the immersion bath 10.

The additive input mechanism 30 comprises a weighing bath 31 for weighing a predetermined amount of additive and pooling it and an input valve 32. The weighing bath 31 weighs a predetermined amount of hexafluorosilicic acid solution ($H_2SiF_6+H_2O$) supplied from a supplier of the hexafluorosilicic acid solution and a predetermined amount of phosphoric acid solution supplied from a supplier of the phosphoric acid solution and pools them therein. Inside the weighing bath 31, the hexafluorosilicic acid solution and the phosphoric acid solution are mixed to compound the additive. Then, when the input valve 32 is opened, a predetermined amount of additive pooled in the weighing bath 31 is inputted into the outside bath 12 of the immersion bath 10.

The trap agent input mechanism 40 comprises a weighing bath 41 for weighing a predetermined amount of trap agent and pooling it and an input valve 42. The weighing bath 41 weighs a predetermined amount of fluoroboric acid solution (HBF$_4$+H$_2$O) supplied from a supplier of the fluoroboric acid solution and a predetermined amount of phosphoric acid solution supplied from a supplier of the phosphoric acid solution and pools them therein. Inside the weighing bath 41, the fluoroboric acid solution and the phosphoric acid solution are mixed to compound the trap agent. Then, when the input valve 42 is opened, a predetermined amount of trap agent pooled in the weighing bath 41 is inputted into the outside bath 12 of the immersion bath 10.

The reason why the additive and the trap agent are inputted into the outside bath 12 of the immersion bath 10 from the additive input mechanism 30 and the trap agent input mechanism 40, respectively, is that the change and distribution of the respective concentrations of additive and trap agent in the inside bath 11 becomes stabler when the additive and the trap agent are inputted into the outside bath 12 and then supplied them to the inside bath 11 once through the circulation line 20, instead of being inputted directly into the inside bath 11.

Further, the substrate processing apparatus 1 is provided with a supply valve 50 for directly supplying the phosphoric acid solution into the immersion bath 10. By opening the supply valve 50, it is possible to directly supply the phosphoric acid solution to the inside bath 11 of the immersion bath 10 from the supplier of the phosphoric acid solution. This supply valve 50 is used to supply a new phosphoric acid solution to the immersion bath 10 in the change of solution.

The substrate processing apparatus 1 is further provided with a control part 60 to control the entire apparatus. The control part 60 has a constitution of general computer system as hardware. Specifically, the control part 60 comprises a CPU for performing various computations, a ROM for storing a basic program, a RAM which is a readable and writable memory for storing various information and a magnetic disk or the like for storing control applications or data. The CPU of the control part 60 performs a predetermined software and the control part 60 thereby controls open and close of the input valves 32 and 42. The control part 60 also controls other operation parts in the substrate processing apparatus 1, such as the supply valve 50, the circulation pump 21, the heater 23, the elevation mechanism for the lifter 13 and the like.

Besides the above constituent elements, the substrate processing apparatus 1 comprises a temperature sensor for measuring the temperature of the phosphoric acid solution in the immersion bath 10, a recovery mechanism for discharging the used phosphoric acid solution from the circulation line 20 and recovering the phosphoric acid solution, or the like (which are not shown).

Next, discussion will be made on a detailed operation of the substrate processing apparatus 1 having the above constitution. First, the circulation pump 21 sends the phosphoric acid solution at a constant flow rate under pressure at all times regardless of whether substrates W are immersed in the phosphoric acid solution pooled in the immersion bath 10 or not. The phosphoric acid solution circulated to the immersion bath 10 through the circulation line 20 is supplied from the bottom portion of the inside bath 11. This causes an upflow of the phosphoric acid solution towards the upper portion from the bottom portion inside the inside bath 11. The phosphoric acid solution supplied from the bottom portion then overflows from the upper end portion of the inside bath 11 to flow into the outside bath 12. The phosphoric acid solution flowing into the outside bath 12, going through the circulation line 20, is then collected and circulated to the immersion bath 10 again under pressure by the circulation pump 21. Thus, the circulation process is continuously performed. In the circulation through the circulation line 20, the extraneous matters contained in the phosphoric acid solution are cleared off by the filter 22. The circulated phosphoric acid solution is heated again by the heater 23 to the predetermined processing temperature.

While the circulation process for the phosphoric acid solution is performed through the circulation line 20, the lifter 13 which receives a lot consisting of a plurality of substrates W at the passing position goes down to the processing position to immerse the substrates W into the phosphoric acid solution pooled in the inside bath 11. This causes an etching process, to selectively etch the silicon nitride film out of the silicon oxide film and the silicon nitride film which are formed on the substrates W. Thus, the silicon nitride film is gradually removed. After a predetermined time period, when the etching process is finished, the lifter 13 goes up again to the passing position to draw the substrates W out from the etching solution. After that, a new lot is immersed into the phosphoric acid solution in the inside bath 11 by the lifter 13 and the etching process is thereby repeated.

The siloxane is generated when the process of etching the silicon nitride film is performed by using the phosphoric acid solution, and there is an appropriate range for the concentration of siloxane in the phosphoric acid solution in accordance with the purpose of processing. When the concentration of siloxane is too low, the etching rate of the silicon oxide film increases and the etching selection ratio of the silicon nitride film is thereby lowered as discussed earlier. On the other hand, the change from the used phosphoric acid solution to a new phosphoric acid solution is regularly performed also in the substrate processing apparatus 1, and the concentration of siloxane in the phosphoric acid solution newly supplied into the immersion bath 10 is almost 0%.

Therefore, immediately after the new phosphoric acid solution is supplied into the immersion bath 10, the etching process can not be started on the substrates W to be processed and the additive input mechanism 30 initially inputs the additive into the new phosphoric acid solution. The additive inputted by the additive input mechanism 30 is a mixed solution of the hexafluorosilicic acid solution and the phosphoric acid solution. By inputting the additive containing the hexafluorosilicic acid solution, a reaction expressed by Eq. 1 proceeds in the immersion bath 10.

$$H_2SiF_6 + 2H_2O \rightarrow 6HF + SiO_2 \quad \text{(Eq. 1)}$$

SiO$_2$ generated herein is a kind of siloxane, and this increases the concentration of siloxane in the early period. Further, hydrofluoric acid (HF) generated herein is decomposed as expressed by Eq. 2

$$3HF \rightarrow HF_2^- + F^- + 2H^+ \quad \text{(Eq. 2)}$$

HF$_2^-$ decomposed as shown in Eq. 2 increases the etching rate of the silicon oxide film while F$^-$ increases the etching rate of the silicon nitride film. In the first preferred embodiment, the phosphoric acid solution in the immersion bath 10 is heated up to 150° C. and a very large amount of F$^-$ is generated by the decomposition shown in Eq. 2 in this temperature range.

Therefore, by inputting the additive containing the hexafluorosilicic acid solution into the phosphoric acid solution newly supplied into the immersion bath 10, the concentration of siloxane in the early period increases and the etching rate of the silicon nitride film can be increased. By performing the etching process on the substrates W with the phosphoric acid solution into which the additive containing the hexafluorosilicic acid solution is thus inputted, it is possible to increase the etching selection ratio of the silicon nitride film.

Figure 2:
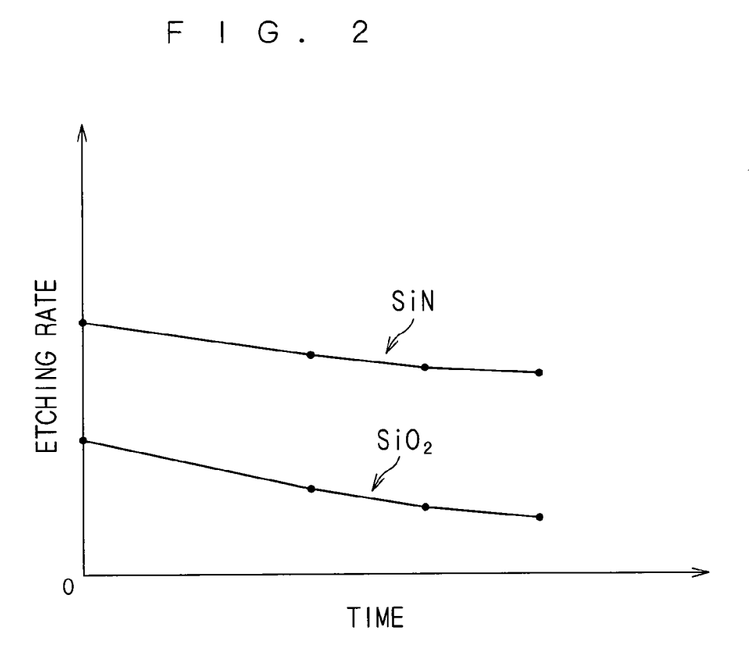
FIG. 2 is a graph showing changes of respective etching rates of a silicon oxide film and a silicon nitride film in a case where an etching process is performed by using a phosphoric acid solution into which an additive containing a hexafluorosilicic acid solution is initially inputted.

FIG. 2 is a graph showing changes of respective etching rates of the silicon oxide film and the silicon nitride film in a case where then etching process is performed by using the phosphoric acid solution into which the additive containing the hexafluorosilicic acid solution is initially inputted. As shown in FIG. 2, with time, both the etching rates of the silicon oxide film and the silicon nitride film decrease. This is because $F^-$ volatilizes and decreases with time to lower the etching rate of the silicon nitride film and the concentration of siloxane in the phosphoric acid solution increases to lower the etching rate of the silicon oxide film. In other words, only by initially inputting the additive containing the hexafluorosilicic acid solution, good etching characteristics can be initially achieved but the etching characteristics can not be maintained for a long time.

Figure 3:
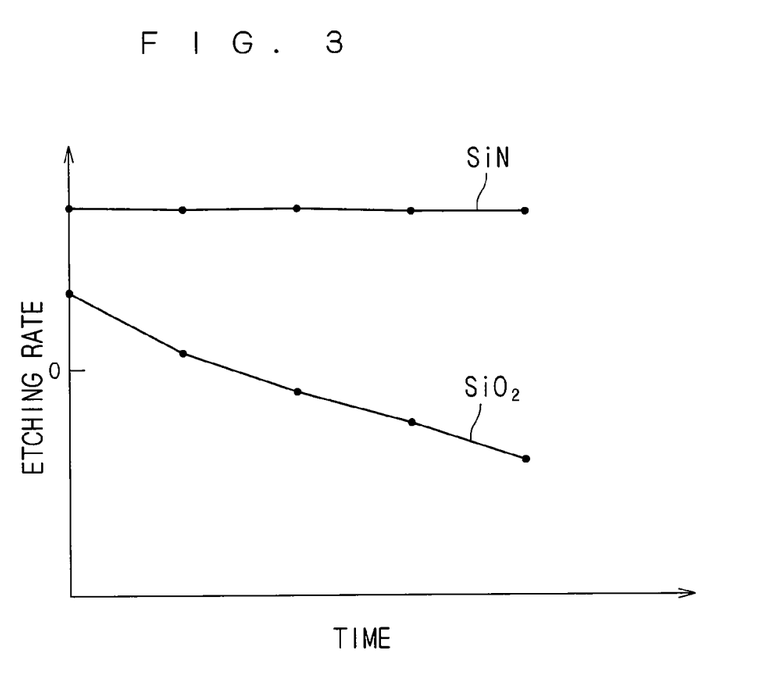
FIG. 3 is a graph showing changes of the respective etching rates of the silicon oxide film and the silicon nitride film in a case where the etching process is performed by using the phosphoric acid solution into which the additive is sequentially inputted.

For this reason, the control part 60 controls the additive input mechanism 30 to sequentially input the additive containing the hexafluorosilicic acid solution at regular intervals. FIG. 3 is a graph showing changes of the respective etching rates of the silicon oxide film and the silicon nitride film in a case where the etching process is performed by using the phosphoric acid solution into which the additive is sequentially inputted. By sequentially inputting the additive, $F^-$ is added into the phosphoric acid solution in the immersion bath 10 as appropriate and the etching rate of the silicon nitride film is kept at the initial state. As the additive is sequentially inputted, however, the siloxane generated by the reaction shown in Eq. 1 is excessively accumulated in the phosphoric acid solution and the etching rate of the silicon oxide film thereby quickly decreases. Then, as shown in FIG. 3, after a lapse of predetermined time, the state changes into a deposition mode (where the etching rate is negative) in which the excessively accumulated siloxane is conversely deposited on the silicon oxide film and its film thickness thereby increases.

In other words, in the case where the additive containing the hexafluorosilicic acid solution is sequentially inputted, initial good etching rate of the silicon nitride film can be maintained but the etching rate of the silicon oxide film quickly decreases and changes into negative at a certain point and later. Therefore, also in this case, the initial etching characteristics can not be maintained.

Then, in the first preferred embodiment, the additive input mechanism 30 sequentially inputs the additive containing the hexafluorosilicic acid solution at regular intervals and the trap agent input mechanism 40 inputs the trap agent every time when the etching process is performed on one lot consisting of a predetermined number of substrates W. The trap agent inputted by the trap agent input mechanism 40 is a mixed solution of the fluoroboric acid solution and the phosphoric acid solution. The trap agent containing the fluoroboric acid solution is decomposed in the phosphoric acid solution in the immersion bath 10 as shown in Eq. 3.

$$HBF_4 \rightarrow HF + BF_3 \qquad (Eq. 3)$$

At that time, the hydrofluoric acid (HF) generated by decomposition of the fluoroboric acid etches the $SiO_2$. This prevents the siloxane generated by the reaction of Eq. 1 from being excessively accumulated in the phosphoric acid solution.

Figure 4:
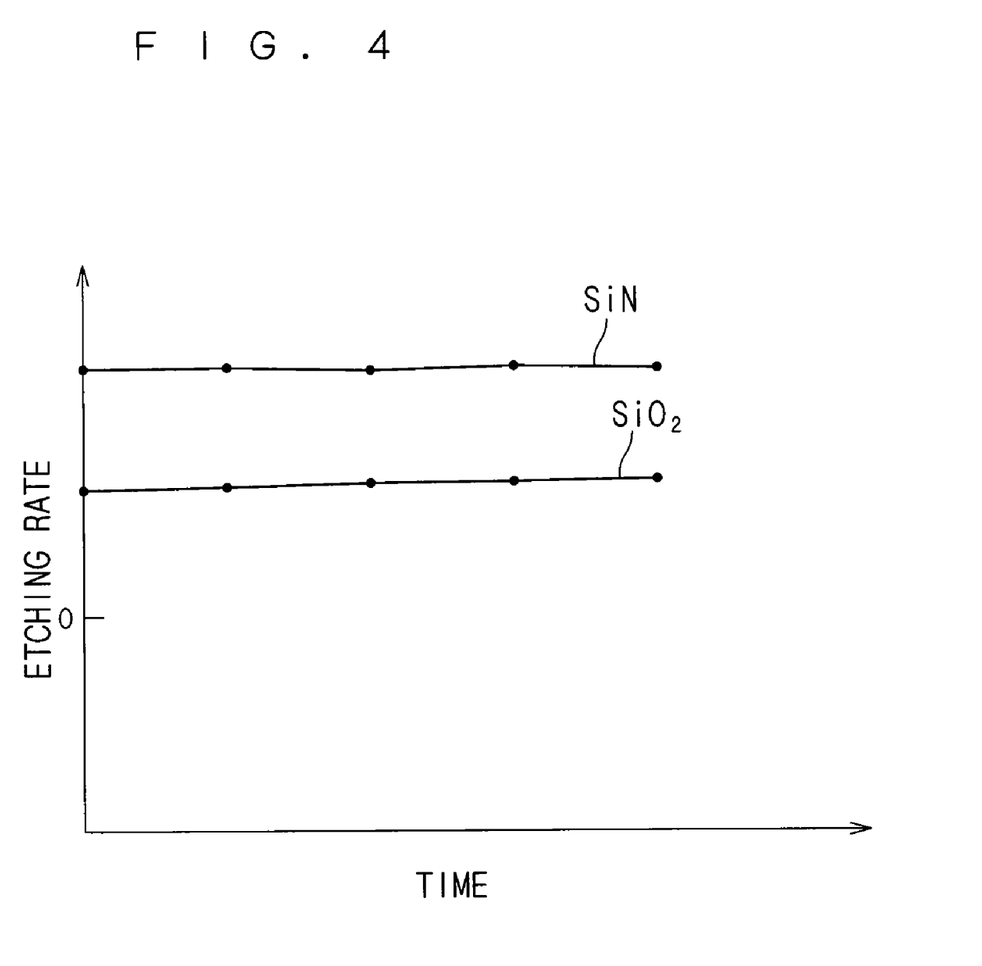
FIG. 4 is a graph showing changes of the respective etching rates of the silicon oxide film and the silicon nitride film in a case where the etching process is performed by using the phosphoric acid solution into which a trap agent containing a fluoroboric acid solution is inputted as well as the additive is sequentially inputted.

FIG. 4 is a graph showing changes of the respective etching rates of the silicon oxide film and the silicon nitride film in a case where the etching process is performed by using the phosphoric acid solution into which the trap agent containing the fluoroboric acid solution is inputted as well as the additive is sequentially inputted. As discussed above, $F^-$ is added into the phosphoric acid solution in the immersion bath 10 as appropriate by sequentially inputting the additive containing the hexafluorosilicic acid solution and the etching rate of the silicon nitride film is thereby kept at the initial state. Further, the siloxane generated by sequential input of the additive is etched with the hydrofluoric acid generated by decomposition of the fluoroboric acid contained in the trap agent. In other words, the trap agent containing the fluoroboric acid solution traps the siloxane generated by sequential input of the additive. This suppresses an increase in the concentration of siloxane in the phosphoric acid solution and the etching rate of the silicon oxide film can be kept at the initial state. As a result, as shown in FIG. 4, both the etching rates of the silicon nitride film and the silicon oxide film can be kept at initial good state.

Thus, in the first preferred embodiment, the additive input mechanism 30 sequentially inputs the additive containing the hexafluorosilicic acid solution at regular intervals and the trap agent input mechanism 40 inputs the trap agent every time when the etching process is performed on one lot consisting of a predetermined number of substrates W. Specifically, in accordance with the respective input timings of the additive and the trap agent set in advance, the control part 60 controls the additive input mechanism 30 and the trap agent input mechanism 40 to input the additive and the trap agent into the immersion bath 10, respectively.

Figure 5:
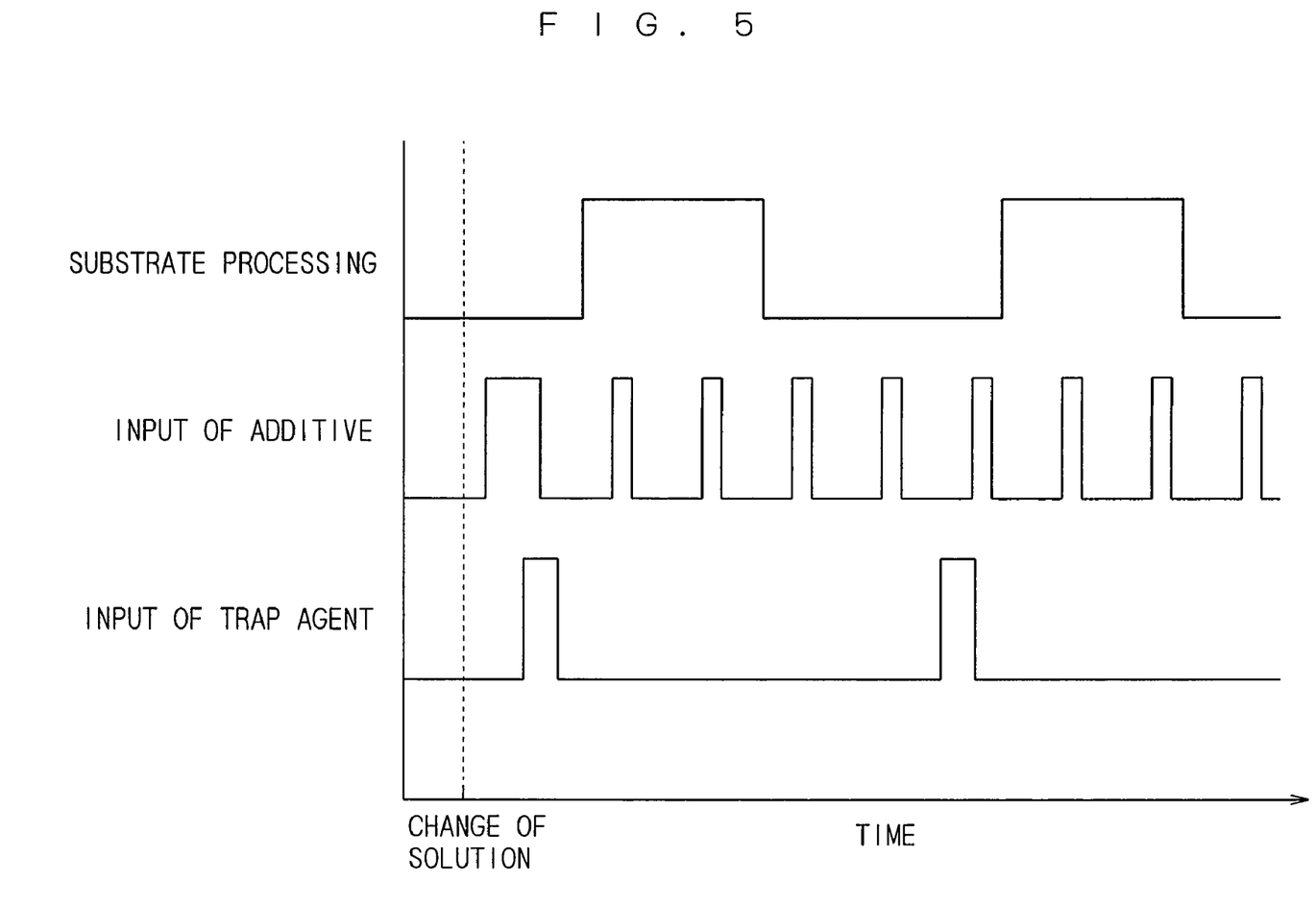
FIG. 5 is a timing chart showing an example of respective input timings of the additive and the trap agent.

FIG. 5 is a timing chart showing an example of respective input timings of the additive and the trap agent. As shown in FIG. 5, after the change of the phosphoric acid solution in the immersion bath 10 and the temperature control thereof are completed, the additive containing the hexafluorosilicic acid solution is initially inputted. By this initial input, the initial concentration of siloxane increases and a very large amount of $F^-$ is generated, to thereby increase the etching rate of the silicon nitride film. Further, immediately before the etching process is performed on a lot consisting of a predetermined number of substrates W, the trap agent input mechanism 40 inputs the trap agent containing the fluoroboric acid solution. Then, the first lot of substrates W is immersed in the phosphoric acid solution into which the additive and the trap agent are inputted and the etching process is performed thereon.

After that, regardless of whether there is a processing on a lot or not, the control part 60 controls the additive input mechanism 30 to sequentially input the additive at regular intervals. Further, the control part 60 controls the trap agent input mechanism 40 to input the trap agent immediately before the etching process is performed on a lot consisting of a predetermined number of substrates W in the immersion bath 10. With this operation, $F^-$ is added into the phosphoric acid solution in the immersion bath 10 as appropriate while the siloxane generated by sequential input of the additive is etched with the trap agent, to thereby suppress a significant increase in the concentration of siloxane in the phosphoric acid solution. As a result, both the etching rates of the silicon nitride film and the silicon oxide film can be kept at initial good state as shown in FIG. 4.

2. The Second Preferred Embodiment

Next, the second preferred embodiment of the present invention will be discussed. The construction of the substrate processing apparatus of the second preferred embodiment is completely the same as that of the substrate processing apparatus 1 of the first preferred embodiment. The second preferred embodiment is different from the first preferred embodiment in the timing of inputting the trap agent. In the first preferred embodiment, the trap agent is inputted every time when the etching process is performed on one lot consisting of a predetermined number of substrates W while in the second preferred embodiment, the trap agent is inputted on the basis of the concentration of siloxane measured by the concentration meter 24.

Also in the second preferred embodiment, in order to increase the etching selection ratio of the silicon nitride film, the control part 60 controls the additive input mechanism 30 to initially input the additive containing the hexafluorosilicic acid solution and sequentially input the same at regular intervals. As discussed earlier, $F^-$ is added into the phosphoric acid solution in the immersion bath 10 as appropriate by sequential input of the additive and the etching rate of the silicon nitride film is thereby kept at the initial state, but the siloxane is excessively accumulated in the phosphoric acid solution and the etching rate of the silicon oxide film thereby quickly decreases. Then, after a lapse of predetermined time, the excessively accumulated siloxane is conversely deposited on the silicon oxide film and its film thickness thereby increases.

In the second preferred embodiment, the additive input mechanism 30 sequentially inputs the additive containing the hexafluorosilicic acid solution at regular intervals and the trap agent input mechanism 40 inputs the trap agent when the concentration of siloxane in the phosphoric acid solution which is measured by the concentration meter 24 is not lower than a predetermined threshold value. Specifically, while the circulation process for the phosphoric acid solution is performed through the circulation line 20, the concentration meter 24 always monitors the concentration of siloxane in the phosphoric acid solution in the immersion bath 10 and the measurement result is sent to the control part 60. The threshold value for the concentration is stored in a memory of the control part 60 in advance. Then, the control part 60 controls the trap agent input mechanism 40 to input the trap agent when the concentration of siloxane measured by the concentration meter 24 is not lower than the threshold value.

Like in the first preferred embodiment, the trap agent inputted by the trap agent input mechanism 40 is a mixed solution of the fluoroboric acid solution and the phosphoric acid solution. The reaction caused by inputting the trap agent into the phosphoric acid solution in the immersion bath 10 is also the same as that in the first preferred embodiment. Specifically, the siloxane generated by sequential input of the additive is etched with the hydrofluoric acid generated by decomposition of the fluoroboric acid contained in the trap agent.

The etching rate of the silicon nitride film can be kept at the initial state by sequentially inputting the additive containing the hexafluorosilicic acid solution, and further the siloxane generated by sequential input of the additive is trapped by the trap agent and this suppresses an increase in the concentration of siloxane in the phosphoric acid solution and makes it possible to keep the etching rate of the silicon oxide film at the initial state. As a result, like in the first preferred embodiment, both the etching rates of the silicon nitride film and the silicon oxide film can be kept at initial good state.

Figure 6:
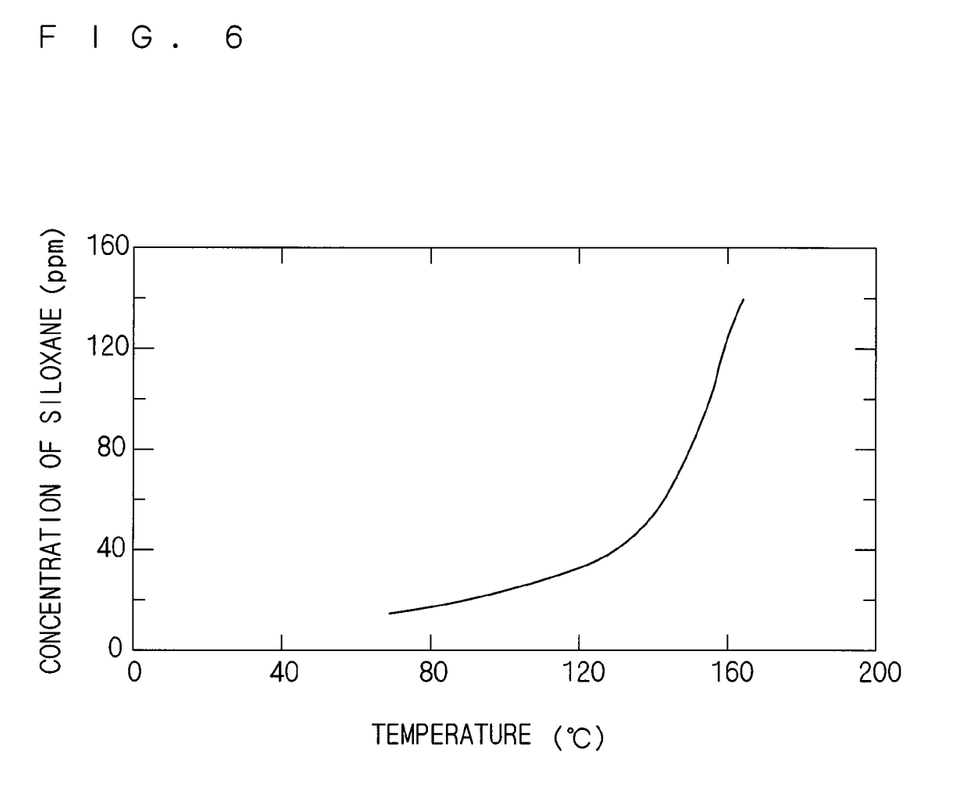
FIG. 6 is a graph showing a saturation concentration of siloxane in the phosphoric acid solution.

The above threshold value is set to any concentration value within a range not lower than 80 ppm and not higher than 120 ppm. FIG. 6 is a graph showing a saturation concentration of siloxane in the phosphoric acid solution. In FIG. 6, the horizontal axis represents the temperature of the phosphoric acid solution and the vertical axis represents the concentration of siloxane. As the temperature of the phosphoric acid solution rises, the saturation concentration of siloxane becomes higher. The process of selectively etching the silicon nitride film by using the phosphoric acid solution is performed at high processing temperatures in a range from 150° C. to 160° C. In this temperature range, as shown in FIG. 6, the concentration range not lower than 80 ppm and not higher than 120 ppm is a relatively high concentration range close to the concentration in which the siloxane is deposited (saturation concentration). If the threshold value is set to a concentration value higher than 120 ppm, the trap agent is inputted after the siloxane is deposited on the silicon oxide film and its film thickness increases, and therefore it is impossible to keep the etching rate of the silicon oxide film constant. On the other hand, if the threshold value is set to a concentration value lower than 80 ppm, the concentration of siloxane becomes too low after input of the trap agent and the etching rate of the silicon oxide film increases, and it is therefore impossible to keep the etching rate constant. For this reason, the threshold value is set to any concentration value within a range not lower than 80 ppm and not higher than 120 ppm.

3. Variations

Though the preferred embodiments of the present invention have been discussed above, besides the above preferred embodiments, numerous modifications and variations can be devised without departing from the scope of the invention. For example, the input timings of the additive and the trap agent are not limited to those discussed in the first and second preferred embodiments but may be changed as appropriate in accordance with the details of the etching process and the required etching rate.

The compositions of the additive and the trap agent or the amount to be inputted for each operation may be set as appropriate in accordance with the details of the etching process and the required etching rate. In other words, only if $F^-$ which accelerates etching of the silicon nitride film is added as appropriate by sequentially inputting the additive containing the hexafluorosilicic acid solution into the phosphoric acid solution and the increasing siloxane is etched by inputting the trap agent containing the fluoroboric acid solution, the compositions, the amount to be inputted, the input timings and the like of the additive and the trap agent may be set as appropriate.

Though the amount of trap agent to be inputted and the input timing thereof should be optimized in accordance with the total amount of silicon nitride film to be etched on the substrates W, it is very difficult to calculate the total amount of silicon nitride film to be etched on the substrates W during the process. Then, by inputting the trap agent every time when the etching process is performed on one lot as shown in the firs preferred embodiment or inputting the trap agent when the concentration of siloxane in the phosphoric acid solution is not lower than a predetermined threshold value as shown in the second preferred embodiment, it is possible to determine the input timing of the trap agent relatively easily.

Further, though a predetermined amount of additive and a predetermined amount of trap agent are weighed by using the weighing baths 31 and 41, respectively, and then inputted in the above preferred embodiments, only if a predetermined amount of additive and a predetermined amount of trap agent can be precisely inputted, other devices such as a massflow controller and the like may be used.

Furthermore, though the additive is a mixed solution of the hexafluorosilicic acid solution and the phosphoric acid solution in the above preferred embodiments, nitric acid ($HNO_3$) may be added thereto.

In the above preferred embodiments, the outside bath 12 is not indispensable, and there may be another construction where both ends of the pipe of the circulation line 20 communicate with the inside bath 11 and the phosphoric acid solution inside the inside bath 11 is circulated by the circulation line 20. The mechanism for moving a plurality of substrates W up and down is not limited to the exemplary case where the lifter 13 directly holds the substrates W, the lifter 13 may hold a carrier accommodating a plurality of substrates W and move up and down.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method for performing an etching process by immersing a substrate on which a silicon oxide film and a silicon nitride film are formed into a phosphoric acid solution to etch the silicon nitride film, comprising the steps of:
    a) performing a process of etching a silicon nitride film by immersing said substrate into a phosphoric acid solution;
    b) inputting an additive containing a hexafluorosilicic acid into said phosphoric acid solution; and
    c) inputting a trap agent containing a fluoroboric acid into said phosphoric acid solution to thereby trap siloxane generated by the input of said additive, to suppress an increase in the concentration of siloxane in said phosphoric acid solution.

2. The substrate processing method according to claim 1, wherein
    said additive is sequentially inputted into said phosphoric acid solution at constant time intervals.

3. The substrate processing method according to claim 2, wherein
    said trap agent is inputted into said phosphoric acid solution every time when the etching process is performed on one lot consisting of a predetermined number of substrates.

4. The substrate processing method according to claim 2, wherein
    said trap agent is inputted when the concentration of siloxane contained in said phosphoric acid solution is not lower than a predetermined threshold value.

5. A substrate processing method for performing an etching process by immersing a substrate on which a silicon oxide film and a silicon nitride film are formed into a phosphoric acid solution to etch the silicon nitride film, the method comprising the steps of:
    a) performing a process of etching a silicon nitride film by immersing said substrate into a phosphoric acid solution;
    b) sequentially inputting an additive containing a hexafluorosilicic acid into said phosphoric acid solution at constant time intervals; and
    c) inputting a trap agent containing a fluoroboric acid into said phosphoric acid solution when the concentration of siloxane contained in said phosphoric acid solution is not lower than a predetermined threshold value, wherein said threshold value is in a range not lower than 80 ppm and not higher than 120 ppm.

* * * * *